United States Patent [19]

Lienard et al.

[11] Patent Number: 4,646,148

[45] Date of Patent: Feb. 24, 1987

[54] PROCESS OF COMPRESSING A SUCCESSION OF DIGITAL DATA AND DEVICE FOR CARRYING OUT THE SAME

[75] Inventors: Jean Lienard, Meudon la Foret; Xavier Denoize, Paris; Diane Dessales-Martin, Clamart, all of France

[73] Assignee: Thomson-CGR, Paris, France

[21] Appl. No.: 671,489

[22] Filed: Nov. 14, 1984

[30] Foreign Application Priority Data

Nov. 15, 1983 [FR] France ................ 83 18132

[51] Int. Cl.[4] .............. H04N 7/12; H04N 1/40; H04N 1/417
[52] U.S. Cl. ................... 358/135; 358/260; 375/28; 375/122; 382/56
[58] Field of Search ............ 358/133, 135, 136, 260, 358/261; 375/27, 28, 122; 382/56

[56] References Cited

U.S. PATENT DOCUMENTS

| | | |
|---|---|---|
| 3,560,639 | 3/1973 | Centanni . |
| 3,723,879 | 2/1971 | Kaul et al. . |
| 4,097,903 | 6/1978 | Nakagome et al. ........... 358/261 |
| 4,115,815 | 9/1978 | Nakagome et al. ........... 358/261 X |
| 4,117,517 | 9/1978 | Shintani et al. ........... 358/260 |
| 4,307,420 | 12/1981 | Ninomiya et al. ........... 358/136 |
| 4,325,085 | 4/1982 | Gooch ........... 358/260 X |

FOREIGN PATENT DOCUMENTS 2405534 8/1975 Fed. Rep. of Germany .
2314618 1/1977 France .

OTHER PUBLICATIONS

Nachrichtentechnische Zeitschrift, vol. 27, No. 3, Mars 1974, pp. 115-117, Berlin (DE); G. Bestelmann: "A Simple High Quality DPCM-Codec . . . ".

Primary Examiner—E. A. Goldberg
Assistant Examiner—Patrick W. Foster
Attorney, Agent, or Firm—Roland Plottel

[57] ABSTRACT

The invention is related to the compression of digitized data to load a buffer memory with a view to the transfer of data towards a mass storage.

The invention consists especially in transmitting the difference $D_n$ between two consecutive pixels $X_{n-1}$ and $X_n$ instead of these latter, this difference being the most often codable on a small number of bits and in suppressing the sign bit whenever possible, i.e. each time that the indetermination on the sign is raised by the comparison between $D_n$ and $X_{n-1}$. The process and device according to the invention are adapted to be applied, in particular, to the storage of images.

14 Claims, 4 Drawing Figures

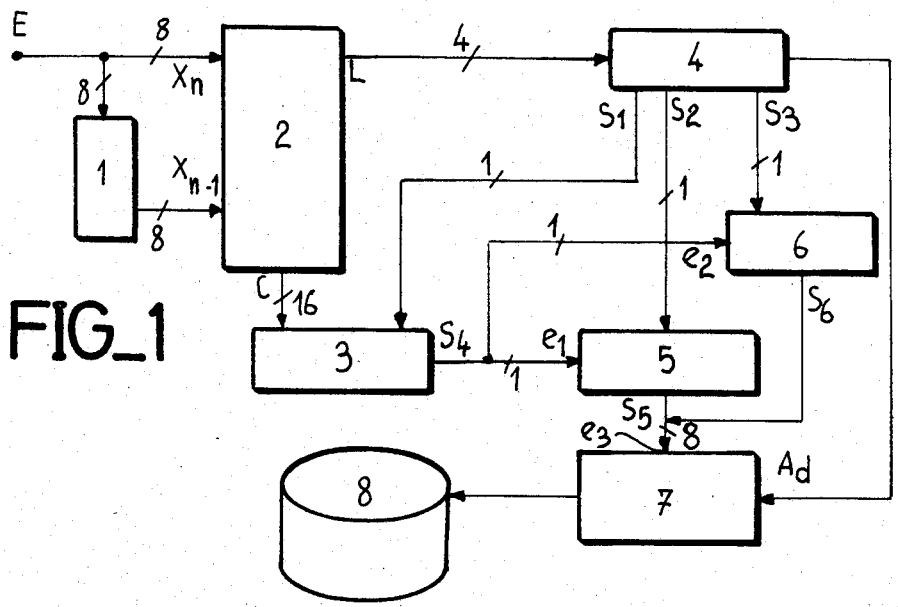
FIG_1
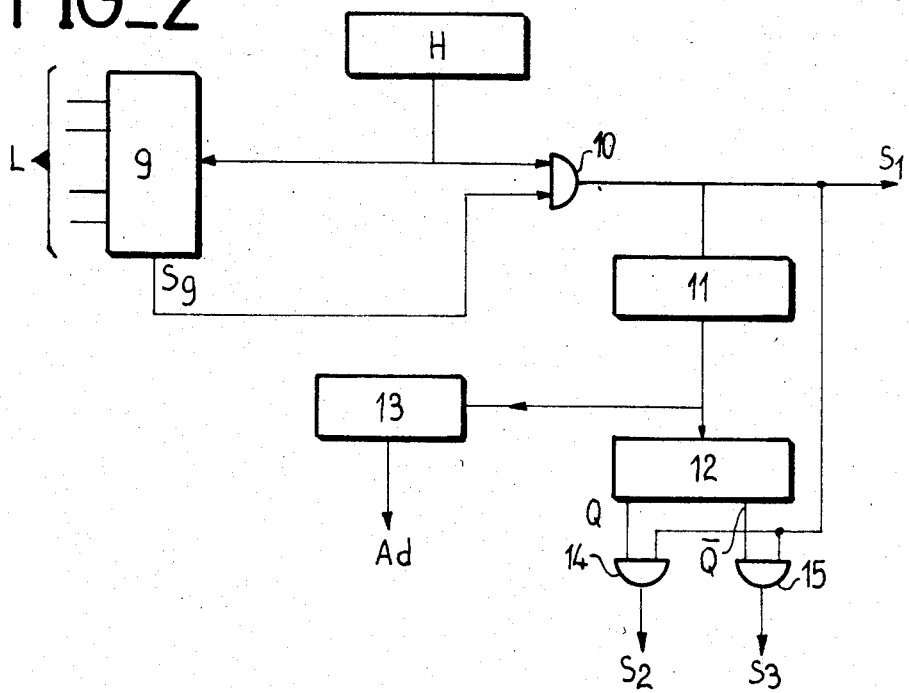
FIG_2

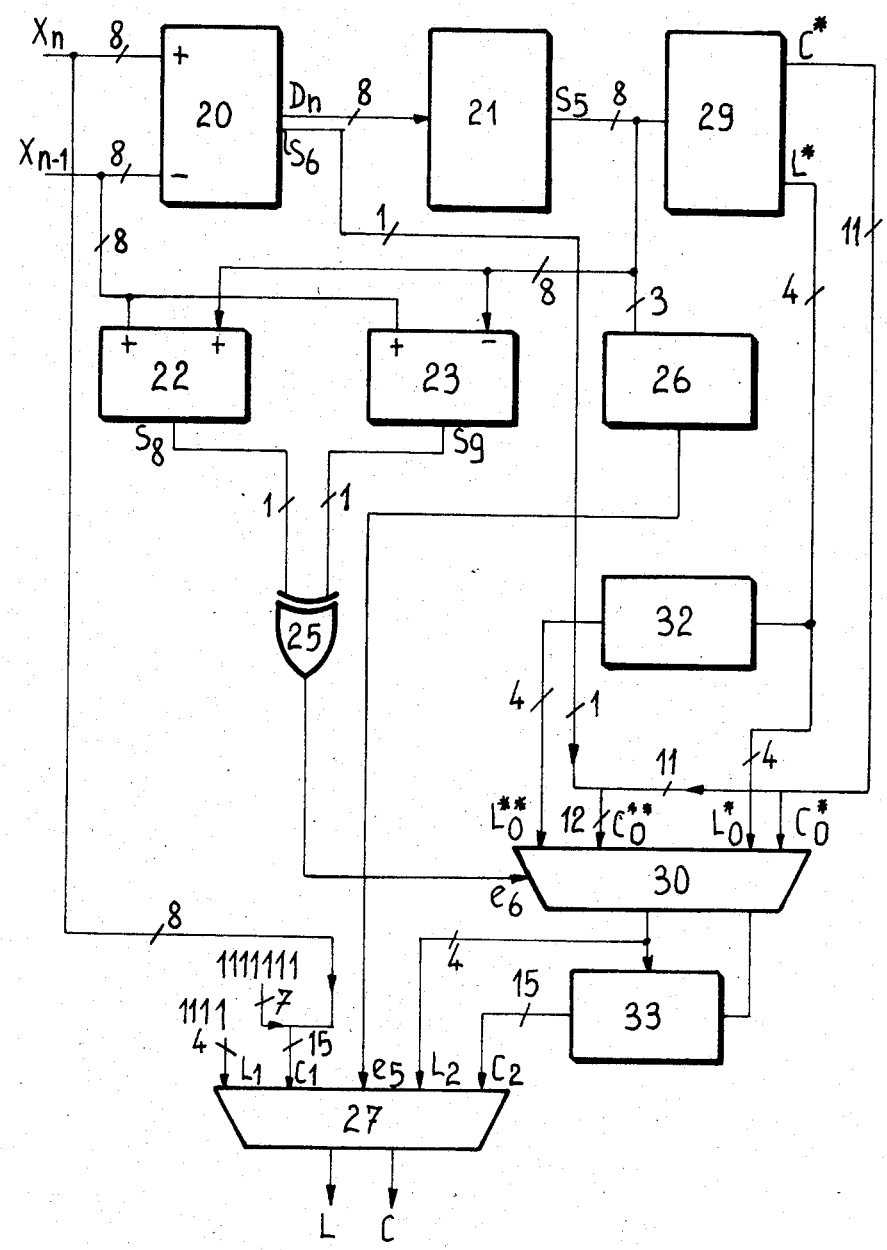
FIG_3

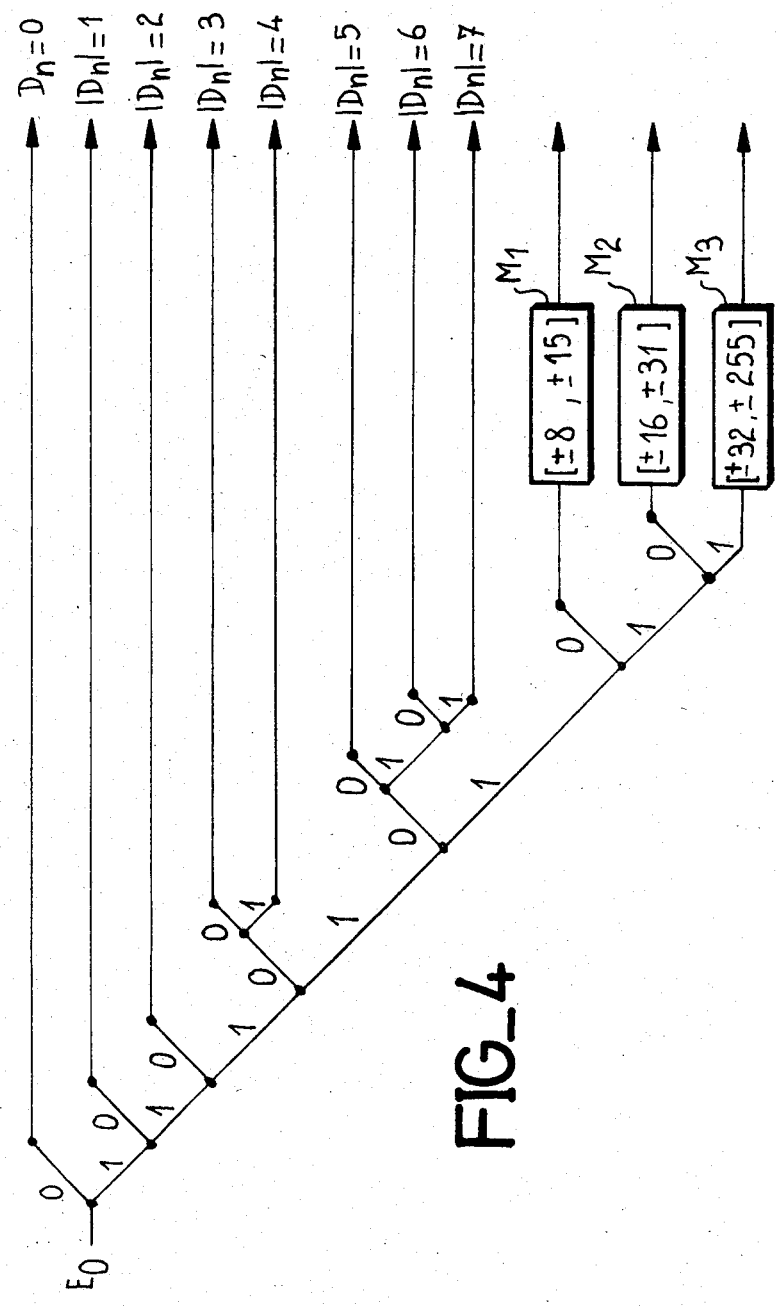
FIG_4

PROCESS OF COMPRESSING A SUCCESSION OF DIGITAL DATA AND DEVICE FOR CARRYING OUT THE SAME

BACKGROUND OF THE INVENTION

The invention concerns a process for compressing a succession of binary digital data, especially representative of the pixels or pels (picture elements) of a digitized image; the invention also concerns a device for carrying out such process.

In a digital image acquisition system, the values of the different elementary zones of the image or pixels are transcribed into words. The value of each word represents the "brightness" of the pixel involved. For example, in the field of digital radiology, the radiological image is displayed by a brightness amplifier, intercepted by a camera and the signal of this camera is sampled. The sample sequence thus elaborated represents, for example, a line by line reading by "scanning" of the different pixels of these lines. The sample sequence is digitized, i.e. transformed into a sequence of words. If, for example, each word is coded on 8 bits, which represents a graduation from 0 to 255 from black to white and if an image is defined of 512×512 pixels, the memory capacity is great, i.e. 2,097,152 bits to be memorized. When numerous images have to be memorized, a mass storage is indispensable. Storing or memorizing on a magnetic disk is a method that is often used. Generally, a buffer storage of limited capacity is linked up to the mass memory, for the transfer of data. The mass storage is thus "fed" with successive readings of data contained in the buffer memory. However, due to current technological limitations the transfer of the contents of the buffer memory towards the mass storage is an operation which requires time and which restricts the performances of the system to a rhythm of images which is insufficient in certain cases, for example, if it is desired to observe rapid phenomena such as the evolution of a contrast product in the blood system or the heart. It is therefore of interest to compress the representative data of an image by exploiting the spacial and/or temporal redundancies inherent therein. The compression rate defines the gain realized after processing. Therefore, a compression rate of 2 means that the buffer memory having the capacity necessary to memorize a normal complete memory, can also recover representative data of two images, after compression. Since the transfer time between the buffer memory and the mass storage is invariable, this means that the acquisition rhythm of the images can be doubled.

A known manner of compressing a succession of digital data results from the observation that two adjacent pixels are seldom very different. Consequently, it is advantageous to memorize not the pixels $X_i$, but the differences $X_i - X_{i-1}$. In fact, if the pixels $X_i$ are coded on 8 bits, i.e. 256 possible values, the difference of the two adjacent pixels can in most cases be coded on a number of bits lower than 5.

However, if a coding is specified, without loss of data, it is necessary to be able to memorize the important differences between adjacent pixels, the appearance probability of which is low but which nevertheless occur, for the details with very contrasted transitions. In order to overcome this problem, codes of variable length have already been proposed, for example, Huffman codes. Such a code results in a conversion table in which each possible difference value (between −225 and +225 for the example as mentioned herein-above) receives a binary code whose length is inversely proportional to its appearance probability Thus, the difference values that appear the most often upon coding during exploration of the image, pixel by pixel, receive the shortest codes.

The invention concerns several improvements to this type of coding.

In the first instance, the invention thus concerns a process of compressing a succession of binary digital data present in the form of fixed format words representing positive integers of an interval [O,N], comprising subtracting each word from the preceding one in such a way as to obtain each time a difference of variable format comprising a sign bit, wherein the said sign bit is suppressed from the said difference for at least certain absolute values of difference, if the absolute value of said difference is higher than the value of the preceding word when it is comprised in the first half of the said interval or unit, or if the absolute value of the said difference is higher than the value of the difference between the number N and the value of the preceding word when it is comprised in the second half of the said interval, and wherein the thus compressed data is transferred, for example, towards a memory.

Another important object of this invention consists in coding directly the value of the pixel once the difference exceeds, in absolute value, a predetermined number. In fact, if pixels coded on 8 bits are considered, for example, a great difference value requires 9 bits in order to be coded, due to the sign of this difference. It thus becomes advantageous to code directly the pixel on 8 bits, since it is necessarily a positive number. In the example that will be described herein-below, the pixel (of 8 bits) is coded directly once the difference exceeds 31 in absolute value.

Furthermore, another particular object of the present invention consists in defining the given intervals of difference possible and in identifying each interval by a given tag. A suffix comprising a number of bits sufficient to represents all the absolute difference values possible in the interval involved, follows directly the tag and a supplementary bit indicates the sign. This manner of identification of the difference values has the advantage of reducing the "tree structure" of the electronic decoding circuits, i.e. the number of logic tests to be carried out prior to fully recognize a word. Thus, for example, the recognition of the tag could be exploited in order to address a table (read-only memory) directly containing all the possible difference values in the interval corresponding to the tag.

The invention also concerns a device for a compression of a succession of binary digital data present in the form of fixed format words representing positive integers of the interval (O,N) comprising a word input to which are applied the said words, a register forming the memory connected to the said input in order to memorize at each instant the value of the preceding word which is applied to the said input, and a memory to receive a succession of digital data of variable length representative of the succession of the said fixed format words, wherein: means are provided for transferring to the said buffer memory either the absolute value of difference between the word applied to the said input and the said preceding word if the absolute value of the said difference is higher than the value of the preceding word when it is comprised in the first half of the said interval or if the absolute value of the said difference is higher than the value of the difference between the number N and the value of the preceding word when it is comprised in the second half of the said interval, or the value of this difference and of its sign in the contrary case.

BRIEF DESCRIPTION OF THE DRAWINGS

The invention will be better understood and other objects, features and advantages will appear from reading through the following description of a particular embodiment of a compression device according to the principle of the invention, given by way of non-limitative example with reference to the appended drawings in which:

FIG. 1 is a block diagram of a compression device according to the invention;

FIG. 2 is a block diagram of a sequencer of the device of FIG. 1;

FIG. 3 is a block diagram of a processing circuit of FIG. 1 for the coding of data, and FIG. 4 illustrates the principle of the decoder.

DETAILED DESCRIPTION OF THE DRAWINGS

FIG. 1 represents the block diagram of a compression circuit of a succession of words representing the pixels of an image. The words of 8 bits are present in the parallel form and are applied to an input E to undergo a compression while the digital data resulting from this compression are registered in series in a buffer memory 7. This memory is linked up to a mass storage 8 (magnetic disk system, for example), and repeated readings of the buffer memory allow to supply or "feed" the mass storage 8. The purpose of the compression is to accelerate the image acquisition rhythm, despite a relatively slow transfer rhythm between memories 7 and 8.

As mentioned herein-above, the compression process consists essentially in memorizing, not the words of 8 bits representing the pixels, but the difference between the successive pixels, by using a code of variable length. The input E is thus connected to an input $X_n$ of the processing circuit 2 which will be described hereinbelow and to register 1 forming a memory the output of which is connected to an input $X_{n-1}$ of processing circuit 2. This latter circuit thus receives at any moment on its two inputs the value of a pixel and that of the preceding pixel. The inputs E, $X_n$, $X_{n-1}$ are parallel inputs of 8 bits (i.e. each presenting 8 lead-in terminals) and register 1 has parallel inputs and parallel outputs, also in 8 bits. In the figures, each parallel connection is conventionally represented by a single wire cut by an oblique stroke next to which is indicated the number of bits of the said connection. Circuit 2 comprises a parallel output C (16 bits) supplying the data (the code) to be registered, coded and "formatized" as well as a parallel output L (4 bits) supplying a representative data of the length of the code appearing simultaneously at output C. Output L is applied to an input of a sequencer 4 comprising 3 clock outputs S1, S2 and S3 respectively connected to control three registers of 8 bits, 3,5 and 6. The arrangement of sequencer 4 will be described herein-below. The output of the processing circuit 2 is connected to the input of register 3 which is of the parallel input and series output type. The sequencer decodes the information length of the code C "formatized" into 16 bits, to be transferred in series towards register 5 or register 6. More specifically, the output S1 supplies each time a number of impulses equal to the length L and this clock signal applied to register 3 controls the transfer of the corresponding most significant bits (MSB) towards register 5 or 6 which is then validated by corresponding clock S2 or S3.

For example, if the word representing a difference $X_n - X_{n-1}$ is equal to a+2, which can be transcribed into compressed binary code: 1100 with L=4 the "formatized" code C with 16 bits will be: 0000000000001100.

But output L programs the sequencer so that it will only generate 4 clock impulses at output S1 on order that only the word 1100 is registered in one of the registers 5 or 6. The format adopted of 16 bits, for code C corresponds to the maximum length of the words to be transferred in the memory 7.

The series output S4 of the register 3 is connected to inputs $E_1$ and $E_2$ of the registers 5 and 6, respectively. These registers are of the series input-parallel output type. Two outputs $S_5$, $S_6$ of these registers are connected to a parallel input $E_3$ of memory 7 which comprises furthermore, an addressing input Ad controlled by a sequencer 4. The presence of registers 5 and 6 is justified by the fact that the memory is disposed in a manner known per se in addressable words of 8 bits. Therefore, the available clocks at outputs S2 and S3 validate alternately registers 5 and 6. Each time that a register 5 (or 6) has received 8 bits issuing from register 3, the sequencer switches the succession of the unloading of register 3 towards the other register 6 (or 5). At the same time, it generates the address of memory 7 to which register 5 (or 6) must be unloaded.

The sequencer is represented in FIG. 2. It comprises a clock generator H that controls a down counter 9 having parallel reference input, connected at output L of circuit 2 and receiving consequently a word representative of the length of the code. The clock generator H is simultaneously connected to an input of an AND gate 10 having two inputs and the output of which constitutes the output S1 controlling register 3. Down counter 9 comprises an output $S_9$ called "zero state" output which changes state when clock H has put the counter back to zero, i.e. when it has supplied a number of impulses corresponding to the length L displayed at the reference input. This output $S_9$ is connected to the other input of gate 10. Its change of state blocks the gate and thus interrupts the transmission of clock impulses to output $S_1$. The output of AND gate 10 is also connected to the input of an adder 11. This counter is an eight counter which controls a flip-flop circuit 12 and an address counter 13. The output of this latter constitutes the output Ad which controls a memory 7. The output Q of circuit 12 is connected to an input of an AND gate 14, having two inputs, while its output $\overline{Q}$ is connected to an input of an AND gate 15 having two inputs. The two other inputs of gates 14 and 15 are connected to output $S_1$. The outputs of gates 14 and 15 constitute the outputs $S_2$ and $S_3$ mentioned herein-above. Therefore, each time that counter 11 has registered 8 clock impulses H transmitted by gate 10, it controls the change of state of the circuit 12, which inverses the validation for registers 5 and 6 for the loading of the data supplied by counter 3. At the same time, counter 11 increases address counter 13 by one unit, for the transfer of data contained in the register which has just been "filled" to a new address of memory 7.

Prior to setting out the description of processing circuit 2 which carries out the essential of the compression operations of the representative data of pixels $X_i$, the processing of coding selected should be explained.

For $D_n$, the difference between two consecutive pixels:

$$D_n = X_n - X_{n-1}$$

since $X_n$ and $X_{n-1}$ are whole integers comprised within a predetermined positive interval (0 to 255), $D_n$ is comprised within the interval (−255 +255). By way of non-limitative example, the conversion of the possible values $D_n$ into binary code can be in accordance with the following table:

| Difference | Code (C) | Length (L) |
|---|---|---|
| 0 | 0 | 1 |
| ±1 | 10S | 3 |
| ±2 | 110S | 4 |
| ±3 | 11100S | 6 |
| ±4 | 11101S | 6 |
| ±5 | 111100S | 7 |
| ±6 | 1111010S | 8 |
| ±7 | 1111011S | 8 |
| ±8 a ±15 | 111110XYZS | 10 |
| ±16 a ±31 | 1111110XYZTS | 12 |
| ±32 a ±255 | 1111111ABCDEFGH | 15 |

It is verified that $D_n=0$, i.e. that the value of difference statistically occuring the most often in the succession of the pixels of the image, is coded with the word of minimal length, i.e. on one bit. The other fairly probable values of difference like for example ±1, ±2, only require three or four bits. The greatest values of difference (like, for example, the interval +16 to +31) require up to 12 bits but their appearance probability is very low so that this has very little effect on the compression rate obtained. In the code, the last bit S represents the sign, for example S=0 if the difference $D_n$ is positive and S=1 if $D_n$ is negative. As will be seen herein-below, the sign bit can, in certain cases, be removed.

Furthermore according to one advantageous aspect of the invention and from an absolute value of difference higher than 7, the code words are disposed with an identification tag and a suffix as well as (possibly) a sign bit S. The identification tag designates a predetermined interval of absolute values of differences. For example, for the double interval of difference (±8 to ±15), a first tag 111110 is defined, for the double interval of differences (±16 to ±31) a second tag 1111110 is defined, and for the double interval of differences (±32 to ±255) a third tag 1111111 is defined. It will be noted that the suffix XYZ comprises a sufficient number of bits (three) to represent all the absolute values of differences possible in the interval (±8 to ±15) since 3 bits allow 8 binary combinations. The same is true for the interval (±16 to ±31), the suffix of which comprises 4 bits: XYZT. On the other hand, according to one advantageous feature of the invention, the fixed format word representing the pixel is directly transferred towards the buffer memory 7 when the absolute value of the difference between this word and the preceding one exceeds a selected number. According to the example, this selected number is 31 which means that for the double interval of differences (±32 to ±255) the ABC-DEFGH suffix represents the value itself of the pixel. In fact, beyond 31, the coding of the difference would require more bits, taking into consideration the necessity of coding the sign S, than the coding of the pixel itself (which is always positive). A third identification tag, namely 1111111 is associated to this suffix.

According to one important characteristic of the invention, the sign bit S is suppressed at the coding each time that this is possible. It should be noted that the conditions for supressing sign bit S, such as explained herein-below, can be applied theoretically on the total interval of possible values of difference (i.e. −255 to +255), but that, due to direct pixel coding in double interval (±32 to ±255), these conditions have meaning only for complementary interval (−31 to +31) not comprising zero. The following examples allow to understand the conditions for supressing sign bit S.

$0 \leq X_i \leq N$ is still relevant, according to the example $0 \leq X_i \leq 255$ (a) It is supposed that $X_{n-1}=0$ whatever the value of the pixel following $X_n$, the difference: $D_n=X_n-X_{n-1}$ is obligatory positive. The sign S of $D_n$ can thus be supressed in every case;

(b) it is supposed that $X_{n-1}=1$, the only possible negative difference is −1, it is thus necessary to code ±1 on 3 bits by maintaining the sign bit.

For all other difference values sign bit S can be removed from $D_n$;

(c) it is supposed that $X_{n-1}=2$, the only possible negative differences are −1 and −2. In order to remove the indetermination, it is thus necessary to code ±1 and ±2 by maintaining the sign bit S. For all other values of differences, bit sign S can be removed from $D_n$. This reasoning can be continued for all the values of the penultimate pixel $X_{n-1}$ comprised in the first half of the variation interval of the pixels $X_i$. In other words, the sign bit S is removed if the absolute value of difference D is higher than the penultimate word when it is comprised in the first half of the interval of the $X_i$. In fact, for the reason mentioned herein-above, this type of test will be stopped once the absolute value of difference is higher than 31;

(d) it is now supposed that $X_{n-1}=N=255$, whatever the value of the following pixel $X_n$, the difference $D_n=X_n-X_{n-1}$ is necessarily negative. The sign S of $D_n$ can also be supressed in every case;

(e) it is supposed that $X_{n-1}=254$, the only possible positive difference is +1 if $X_n=+255$. In order to remove this indetermination the differences $D_n=\pm 1$ are coded on 3 bits while maintaining the sign bit. For every other value of difference, bit S can be removed from $D_n$;

(f) it is supposed that $X_{n-1}=253$, the only possible positive differences are ±1 and ±2 corresponding to $X_n=254$ or $X_n=255$. The differences ±1 and ±2 are thus coded while maintaining the sign bit S.

For all the other values of difference, sign bit S can be removed from $D_n$.

This reasoning can be continued for all the values of the penultimate pixel $X_{n-1}$ comprised within the second half of the variation interval of the pixels $X_i$. In other words, the sign bit is removed if the absolute value of difference $D_n$ is higher than the value of the difference between the number N (N=255) and the value of the penultimate pixel $X_{n-1}$, when it is comprised in the second half of the variation interval of the pixels $X_i$. There again, however, this type of test is abandoned once the difference becomes higher than 31.

A possible embodiment of a processing circuit will now be described with reference to FIG. 3. The inputs $X_n$ and $X_{n-1}$ are directly connected to the inputs of a digital subtractor 20 the parallel output $D_n$ (on 9 bits) of which supplies at every instant the value of the difference: $D_n = X_n - X_{n-1}$ It is possible, for example, to utilize an available integrated circuit of the ALU 4 bits type (TTL 181) proposed by the major manufacturers of semi-conductors. Since the binary representation utilized in the subtractor is a complementary representation in two, a preprogrammable read-only memory (PROM) 21 is used to extract the absolute value of difference. The absolute value appears coded on 8 bits, at a parallel output $S_5$ of the memory 21 and the sign bit appears at an output $S_6$ of the subtractor 20. The read-only memory 21 is addressed directly by the output $D_n$, i.e. the parallel output $D_n$ of the subtractor 20 is connected to an addressing input of the read-only memory, each value of $D_n$ constituting an addressing of the memory 21 in which is registered the corresponding absolute value. The capacity of the memory 21 is reduced since it must contain 512 words of 8 bits. It is possible, for example, to utilize a 82S115 type integrated circuit proposed by the major manufacturers of semi-conductors; a single chip is sufficient in order to realize the memory 21. The programming of this latter memory is within the knowledge of those skilled in the art.

The output $S_5$ and the output $X_{n-1}$ are also connected to two inputs (of the parallel 8 bits type) of a digital adder 22 and to two inputs of a digital subtractor 23, so as to realize the following operations:

$$X_{n-1} + |D_n|$$

$$X_{n-1} - |D_n|$$

Circuits 22 and 23 can be realized from the same type of integrated circuit as the subtractor 20. The "carry over" output $S_8$ of adder 22 and the "carry over" output $S_9$ of the substractor 23 are connected respectively to the two inputs of an exclusive OR gate 25. In other words, output $S_8$ displays the value of the report bit of the operation $X_{n-1} + |D_n|$ while output $S_9$ displays the value of the report bit of the operation $X_{n-1} - |D_n|$. The assembly 22,23,25 which has just been described carries out in a simple manner the whole of the tests (defined herein-above) allowing to determine that, if the sign bit can be suppressed or not. In fact, it is verified whether the two values:

$X_{n-1} + |D_n|$ and $X_{n-1} - |D_n|$ are within the interval (O,N), this means that the sign must be taken into consideration in the transmission of the code C towards the buffer memory. If, on the other hand, a value is present outside the interval (O,N), this means that it is possible to supress the sign bit. These conditions are set forth in the truth table of gate 25, since, if the output of this gate reaches 1, this means that only one of the "carry over" bits has a value 1, i.e. that the result of only one of the operations is outside the interval (O,N).

Furthermore, the output $S_5$ is connected to a comparator 26 which allows to determine whether the absolute value of difference $D_n$ is higher or lower than 31. Practically, this comparator can be a simple OR gate having three inputs to which are connected the three last terminals of output $S_5$ (on which appear the most significant bits). Since the number 31 is expressed in binary code as: 00011111, a higher number will necessarily have at least one of its most significant bits MSB equal to 1. The output of this gate is connected to a control input $e_5$ of a multiplexer 27 the outputs L and C of which are the outputs represented in FIG. 2. This multiplexer comprises two inputs $L_1$, $C_1$ and $L_2$, $C_2$ respectively and its function consists simply in causing to correspond the inputs $L_1$, $C_1$ or $L_2$, $C_2$, the outputs L, C as a function of the control applied to input $e_5$. Input $L_1$ is fixed and expresses the number 15 in binary code, the 8 terminals corresponding to the least significant bits LSB of input $C_1$ receive directly the word $X_n$ while the 7 terminals corresponding to the most significant bits MSB of this same input $C_1$ are all at 1. Therefore, the double transcription Length-Code is simply carried out in the case where the value of the difference belongs to a double interval ($\pm 32$ to $\pm 255$) identified by comparator 26. The multiplexer 27 can be, for example, realized from a 74244 type integrated circuit.

Output $S_5$ of the read-only memory 21 is itself connected to the addressing input of a read-only memory 29 in which are registered the 256 possibilities for the length L and the value of code C, without the sign S, designated respectively by $L^*$ and $C^*$ corresponding to the different possible values of the output $S_5$. Since code $C^*$ requires 11 bits and length $L^*$ requires 4, read-only memory 29 only requires three 82S115 chips. Its addressing programming corresponds to the correspondence table described herein-above, except with respect to the double interval ($\pm 32$ to $\pm 255$) and the sign bit S which does not appear. Outputs $C^*$ and $L^*$ are connected to the corresponding inputs of a multiplexer 30 of the same type as multiplexer 27. The outputs of multiplexer 30 are connected to inputs $L_2$, $C_2$ of multiplexer 27. The function of multiplexer 30 is therefore to connect either the group of inputs $L_0^*$, $C_0^*$ or the group of inputs $L_0^{}$, $C_0^{}$ to the corresponding inputs $L_2$, $C_2$. Control input $e_6$ of multiplexer 30 is connected to the output of the exclusive OR type gate 25. Input $L_0^{**}$ is connected to output L of read-only memory 29 through the intermediary of a binary operator 32 which carries out the following operation:

$$L_0^{**} = L^* + 1$$

this incrementation thus allows to calculate the new length of the code when the sign S is reintroduced. Input $C_0^{**}$ is connected to output $C^*$ of the memory 29 and comprises a supplementary terminal connected to the output $S_6$ of subtractor 20. The control signal applied to input $e_6$ thus allows to select either inputs $L_0^*$, $C_0^*$ when the sign bit S can be suppressed, or inputs $L_0^{}$, $C_0^{}$ when it must be maintained. It is possible to provide a register 33 between multiplexer 30 and input $C_2$ of multiplexer 27 in order to "formatize" the data code to 15 bits, the register being controlled by the length data simultaneously transmitted to input $L_2$.

The operating of the processing circuit of FIG. 3 becomes apparent from reading its description. It can be seen that for all the pairs of pixels $X_n$, $X_{n-1}$, the difference $D_n$ (subtractor 20) is systematically determined, then the absolute value of $D_n$ is classified with reference to the said "selected numbers", i.e. 31, due to comparator 26. This classification allows to position multiplexer 27, i.e. to transmit possibly the word X and its length towards outputs L and C of multiplexer if $|D_n| > 31$. In the opposite case, the sign of the difference is suppressed whenever possible, which is made evident by the positioning of the multiplexer 30 under the control of gate 25. If the sign can be suppressed, outputs L*, C* of the memory 29 become the outputs L, C of the system. In the opposite case, they are completed so as to reintroduce the sign available at output $S_6$.

It is well understood that circuit 2 which has just been described, is available to many variants known to those skilled in the art. Among these it is henceforth advantageous taking into consideration the read-only memories offered in the trade to replace the whole of the circuit by a single programmable read-only memory (PROM) addressed directly by the values $X_n$ and $X_{n-1}$. In other words, by referring once again to FIG. 1, block 2 can be a simple read-only memory. If the inputs $X_n$ and $X_{n-1}$ are each coded on 8 bits, which is assimilable to a parallel addressing input of 16 bits for the read-only memory, there are thus 65536 possible combinations, which means 64K words of 15 bits for code C and 64K words of 4 bits for code L. If for example 27128 type integrated circuits are used, which have each a memory capacity of 16K octets, it is sufficient to utilize eight chips to register once and for all the 64K values possible of code C, and four chips to register the 64K values of length L.

The programming of this read-only memory is within the knowledge of those skilled in the art. It is possible, for example, to simulate the system represented in FIG. 3 on a computer by successively generating all the possible values for $X_n$ and $X_{n-1}$. It is also possible to construct the system shown in FIG. 3 so as to utilize it as a programmer for the PROM.

Consequently, the present invention also concerns all compressing processes in which the codings of the words L and C result only from a simple reading operation in a memory, once this memory has been programmed by carrying out the operations and the tests described herein-above.

The decoding will now be briefly explained. Each point of the "tree structure" of FIG. 4 symbolizes a logic test between 0 and 1. The sequence of the bits representing the data after commpression is applied to the input $E_0$, the first pixel having been coded as such. Consequently, if the following bit is zero, it is considered that $D_n = 0$ is achieved. On the other hand, an incoming bit 1 requires a supplementary test. If the following bit is 0, thus $|D_n| = 1$. On the contrary if this bit is still 1, the process is continued in the tree structure in order to be able to recognize $|D_n| = 2$ if the following bit is zero and so on .... Beyond $|D_n| = 7$, the tree structure is limited, due to the use of tables (read-only memories) containing all the possible combinations of the absolute values of differences comprised in the intervals [8 to 15], [16 to 31] and [32 to 255]. Thus the recognition of five consecutive 1 followed by a zero provokes the addressing of memory $M_1$ (corresponding to the first interval) by the three following bits. The recognition of six consecutive ones followed by a zero initiates the addressing of memory $M_2$ (corresponding to the second interval) by the four following bits, and the recognition of seven consecutive 1 initiates the addressing of memory $M_3$ (corresponding to the third interval) by the following eight bits.

A circuit carrying out the tree structure represented in FIG. 4 can be simply realized from flip-flop circuits and the said read-only memories $M_1$, $M_2$ and $M_3$. It will be observed that the succession of the bits at input $E_0$ thus conditions the recognition of the absolute value of the difference $|D_n|$.

If the value of the preceding pixel is memorized, it is simple to repeat the operations:

$$R+ = X_{n-1} + |D_n|$$

$$R- = X_{n-1} - |D_n|$$

in the same manner as that described with reference to FIG. 3. Once the results R+ and R− of these two operations are available, it is sufficient to check whether R+ and/or R− fall within the interval (O,N). If one single value is within the interval (O,N) it is sufficient to take this value as $X_n$. If, on the other hand, the two values R+ and R− are within the interval (O,N) it is necessary to call up the following bit which is present at input $E_0$, in order to remove the indetermination and complete $|D_n|$ by its sign. The very value of the sign S allows to select the correct value of $X_n$ between R+ and R−. If S=0, this means that the difference is positive and the correct value of $X_n$ is R+. If S=1, this means that the difference $D_n$ is negative and that the correct value of $X_n$ is R−.

What is claimed is:

1. A process of compressing a succession of binary digital data present in the form of fixed format words representing positive integers of an interval [O,N], comprising the step of subtracting each word from the preceding one in such a way as to obtain each time a difference of variable format comprising a sign bit, wherein said sign bit is suppressed from the said difference, for at least certain absolute values of difference, if the absolute value of said difference is higher than the value of the preceding word when it is comprised in the first half of the said interval, or
   if the absolute value of the said difference is higher than the value of the difference between the number N and the value of the preceding word when it is comprised in the second half of the said interval, and wherein
   the thus compressed data are transferred towards a memory.

2. A process according to claim 1, which comprises transferring directly the fixed format word when the absolute value of the difference between this word and the preceding one exceeds a selected number.

3. A process according to claim 1 which comprises in coding part of the said possible differences into words including:
   an identification tag corresponding to a given interval of such difference absolute values,
   a suffix comprising a number of bits sufficient to represent all the absolute values of possible differences within said given interval and,
   possibly a sign bit.

4. A process according to claim 3, wherein the differences comprised between −7 and +7, not including zero difference, are coded on 3 to 8 bits, one of which is a sign bit, without tag, a zero difference being coded on one bit, the differences comprised between 8 and 15 in absolute value being coded on four bits one of which is a sign bit and associated to a first tag, while the differences comprised between 16 and 31 in absolute value are coded on five bits, one of which is a sign bit and associated to a second tag.

5. A process according to claim 4 wherein N is equal to 255, and wherein each word of fixed format for which the absolute value of difference between this word and the preceding one exceeds the said selected number is transmitted as such and associated to a third tag, the said number selected being equal to 31.

6. A process according to claim 5, wherein the said first tag is 111110, the second tag is 1111110 and the said third tag is 1111111.

7. A process according to claim 2, which comprises:
determining systematically the difference between each word of fixed format and the preceding one;
classifying the absolute value of this difference with respect to the specified selected number;
suppressing the sign of the said difference whenever possible if the said absolute value of difference is lower than or equal to the said selected number prior to transmitting the said difference or transmitting directly the said word of fixed format if the said absolute value of the difference is higher than the said selected number.

8. A process according to claim 1, wherein the elementary operations carried out from two consecutive fixed format words until the transfer of the corresponding data after compression consists in reading a read-only memory in which all the results which are possible, considering the values of the two words of fixed format, have been previously registered.

9. A process according to claim 8, wherein the read-only memory is addressed directly by the values of the said consecutive fixed format words.

10. A process according to claim 1, wherein the total and the difference between the specified preceding word and the absolute value of corresponding difference is calculated, and wherein the said sign bit is suppressed only if one of these two calculated values is comprised within the specified interval [O,N].

11. A device for compressing a succession of binary digital data present in the form of fixed format words representing the positive integers of interval [O,N] comprising a word input to which the said words are applied, a register constituting a memory connected to the said input to memorize at every moment the value of the preceding word that is applied to the said input, and a memory to receive a succession of digital data of variable length representative of said succession of fixed format words, said device further comprising: means for transferring towards the said buffer memory;
either the absolute value of the difference between the word applied to the said input and the preceding word if the absolute value of the said difference is higher than the value of the preceding word when the same is comprised in the first half of the said interval or if the absolute value of the said difference is higher than the value of the difference between the number N and the value of the preceding word when this is comprised in the second half of the said interval;
or, in the contrary case, the value of this difference and its sign.

12. A device according to claim 11, wherein the said means comprise a read-only memory in which the results of a coding for all the possible combinations of the values of a word and a preceding word have been previously registered, the said input and the output of the said register being connected to the addressing means of the said read-only memory.

13. A device according to claim 11, wherein the said means comprise:
a fist digital subtractor, the two inputs of which are respectively connected to the said word input and to the output of the said register;
means for extracting the absolute value of difference supplied by the said subtractor;
a digital adder and a digital subtractor, two inputs of which are respectively connected to the output of said register and to the output of the said means for extracting the absolute value;
exclusive OR gate, the two inputs of which are respectively connected to the output of the said subtractor and of the second adder and
means for transferring towards the said memory a representative code of the said absolute value of the difference or the difference itself, under the control of the said exclusive OR.

14. A device according to claim 13, wherein the said transfer means comprise a multiplexer controlled by a comparator connected to the output of the said means for extracting the absolute value of difference, in order to compare this absolute value with a selected positive number, an input of the said multiplexer being connected to the said word input.

* * * * *